(12) United States Patent
Chang et al.

(10) Patent No.: US 8,388,815 B2
(45) Date of Patent: Mar. 5, 2013

(54) COATED ARTICLE AND METHOD OF MAKING THE SAME

(75) Inventors: Hsin-Pei Chang, Tu-Cheng (TW);
 Wen-Rong Chen, Tu-Cheng (TW);
 Huann-Wu Chiang, Tu-Cheng (TW);
 Cheng-Shi Chen, Tu-Cheng (TW); Jia Huang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 46 days.

(21) Appl. No.: 13/154,587

(22) Filed: Jun. 7, 2011

(65) Prior Publication Data
US 2012/0064363 A1 Mar. 15, 2012

(30) Foreign Application Priority Data
Sep. 15, 2010 (CN) .......................... 2010 1 0282300

(51) Int. Cl.
 *C23C 14/34* (2006.01)
 *C22C 29/12* (2006.01)

(52) U.S. Cl. ......... 204/192.15; 204/192.12; 204/192.16; 204/192.22; 204/192.23; 428/643; 428/642; 428/628; 428/622; 428/646; 428/647; 428/648; 428/649; 428/545

(58) Field of Classification Search ............ 204/192.12, 204/192.16, 192.22, 192.23, 192.15; 428/643, 428/642, 628, 629, 622, 646, 647, 648, 649, 428/545
See application file for complete search history.

(56) References Cited

U.S. PATENT DOCUMENTS
7,025,859 B2 * 4/2006 Stachowiak ............. 204/192.22
* cited by examiner

*Primary Examiner* — Keith Hendricks
*Assistant Examiner* — Jason M Berman
(74) *Attorney, Agent, or Firm* — Altis Law Group, Inc.

(57) ABSTRACT

A coated article includes a substrate, a catalyst layer, a bonding layer and a hydrophobic layer. The catalyst layer made of tin is formed on the substrate. The bonding layer is formed on the catalyst layer, including titanium, tin, stannic oxide and titanium dioxide. The hydrophobic layer made of silicon-nitrogen is formed on the bonding layer.

10 Claims, 2 Drawing Sheets

COATED ARTICLE AND METHOD OF MAKING THE SAME

CROSS-REFERENCE TO RELATED APPLICATION

This application is related to co-pending U.S. patent application Ser. No. 13/154,589, entitled "COATED ARTICLE AND METHOD OF MAKING THE SAME". Such application has the same assignee as the present application. The above-identified application is incorporated herein by reference.

BACKGROUND

Technical Field

This disclosure relates to coated article, particularly, to a coated article with a hydrophobic layer and a method of making the same.

The phrase hydrophobic surface generally refers to a surface with a water contact angle greater than 90 degrees, and a super hydrophobic surface generally refers to a surface with a water contact angle greater than 150 degrees. Substrates having a hydrophobic surface may be resistant to water, pollutants such as dust, and be oxidation resistant.

Coating a hydrophobic film on a substrate is a conventional method of forming a hydrophobic surface on the substrate. The hydrophobic film usually includes three types: inorganic hydrophobic film, organic polymer hydrophobic film, and inorganic and organic composite hydrophobic film. Inorganic hydrophobic films are typically formed by a chemical process, e.g., sol-gel process, anode oxidation process, chemical vapor deposition process. However, these processes are easily influenced by environmental factors, and the hydrophobic films formed by these processes may not perform as expected.

Therefore, there is room for improvement within the art.

BRIEF DESCRIPTION OF THE DRAWINGS

Many aspects of the coated article and method of making the same can be better understood with reference to the following drawings. The components in the drawings are not necessarily drawn to scale, the emphasis instead being placed upon clearly illustrating the principles of the coated article and method of making the same.

DETAILED DESCRIPTION

Figure 1:
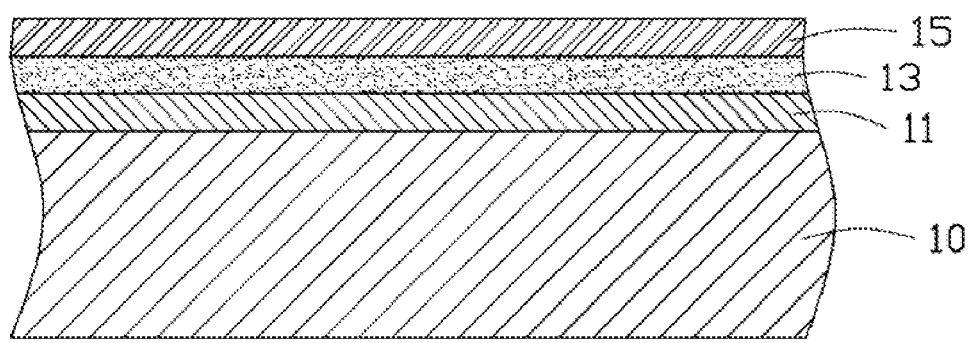
FIG. 1 is a schematic view of a coated article, in accordance with an exemplary embodiment.

FIG. 1 shows an exemplary embodiment of a coated article 100. The coated article 100 includes a catalyst layer 11, a bonding layer 13, and a hydrophobic layer 15 formed on a substrate 10 in that order. Each of the layers 11,13,15 has a thickness in a range of 0.5 μm to 1.0 μm.

The substrate 10 may be made of metal, e.g., stainless steel, aluminum, or non-metal, e.g., ceramics, glass.

The catalyst layer 11 is made of tin. The melting point of tin is lower than titanium. Thus, during the oxidation process, the tin in a lower layer can firstly oxidize, and the tin oxide helps the titanium in an upper layer to oxidize to form the bonding layer 13.

The bonding layer 13 includes titanium, tin, tin oxide and titanium dioxide.

The hydrophobic layer 15 is made of silicon-nitrogen. The silicon-nitrogen can form a very smooth surface on the substrate 10 and has good lubricity.

Figure 2:
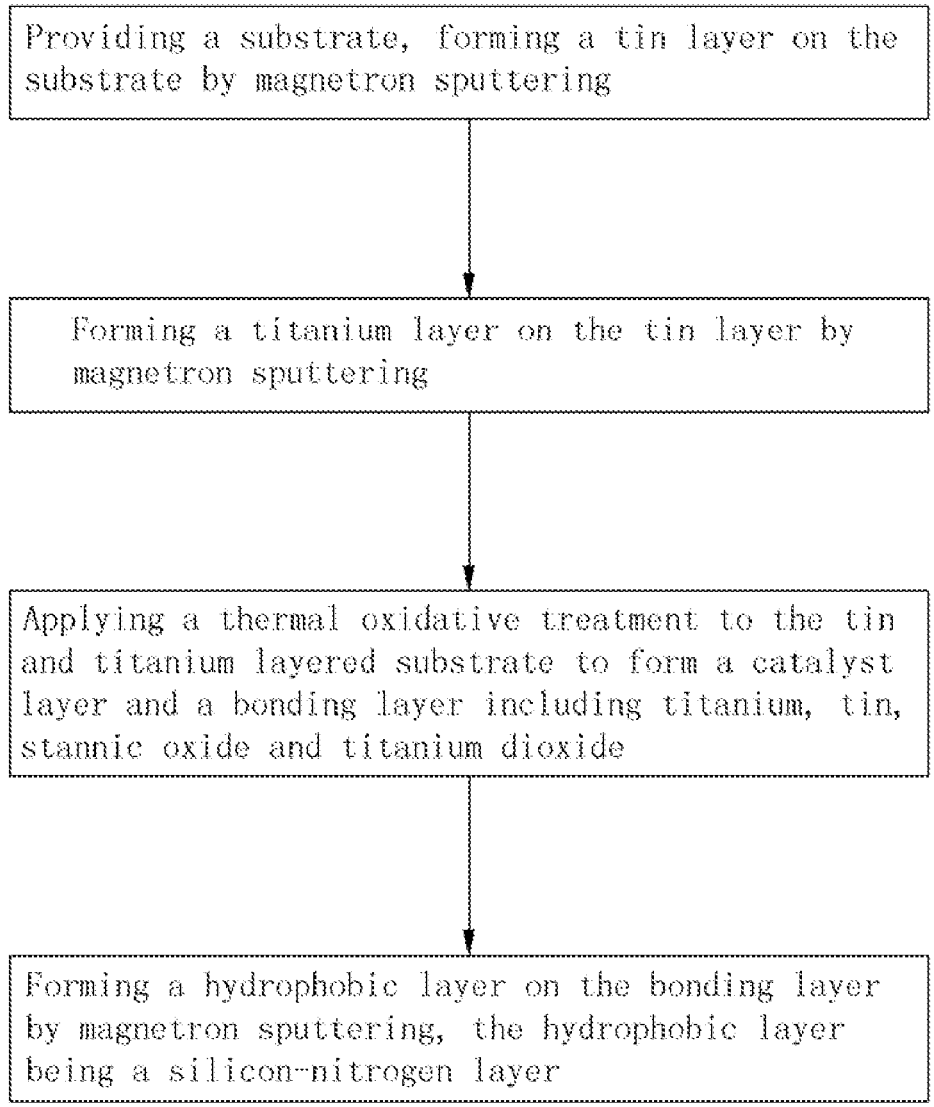
FIG. 2 is a flow schematic view of making the coated article shown in FIG. 1.

Referring to FIG. 2, a method of making the coated article 100 includes the following steps:

A substrate 10 is provided. The substrate 10 may be a metal, e.g., stainless steel, aluminum, or a non-metal, e.g., ceramics, glass.

A surface pre-treatment is applied to the substrate 10. The pre-treatment includes oil cleaning by chemical method, paraffin removal, acid cleaning, cleaning by ultrasound and drying.

The substrate 10 is cleaned by plasma. This process can further remove oil on the substrate 10, which can increase a bonding force between the substrate 10 and the following layer formed on the substrate 10. In this process, the substrate 10 is placed in a vacuum chamber (not shown) of a vacuum sputtering coating machine (not shown). Air in the chamber is pumped out until the pressure in the chamber is about $8*10^{-3}$ pascals (Pa). Argon gas is then input into the chamber at a flow of 50 sccm to 400 sccm. The purity of the argon gas is 99.9999%. A bias voltage in a range of −100V to −200V is applied to the substrate 10, and the substrate 10 is then cleaned with plasma. The time of this cleaning process ranges from about 5 minutes (min) to 10 min.

A tin layer is formed on the substrate 10 by magnetron sputtering. A tin target is provided in the vacuum chamber and is electrically connected to a power source. A pressure in the vacuum chamber is in a range of $4*10^{-3}$ Pa to $5.3*10^{-3}$ Pa. Argon gas is provided as a working gas having a flow in a range of 300 sccm to 500 sccm. The power source connected to the tin target is activated and a bias voltage in a range of −100V to −200V is applied to the tin target. The tin layer is deposited on the surfaces of the substrate 10 at a temperature in a range of 50° C. to 100° C. The time of this depositing process is in a range of 5 min to 10 min. The power source connected to the tin target is closed after the depositing process.

Forming a titanium layer on the tin layer by magnetron sputtering. A titanium target is provided in the vacuum chamber and is connected to a power source. A pressure in the vacuum chamber is in a range of $4*10^{-3}$ Pa to $5.3*10^{-3}$ Pa. Argon gas as a working gas is input to the vacuum chamber at a flow rate in a range of 300 sccm to 500 sccm. The power source connected to the titanium target is activated and a bias voltage in a range of −150V to −200V is applied to the titanium target. A titanium layer is deposited on the tin layer at a temperature of 50° C. to 100° C. The time of this depositing process is in a range of 5 min to 10 min. The power source connected to the titanium target is closed after the depositing process.

Applying a thermal oxidative treatment to the tin and titanium layered substrate 10. In this process, the layered substrate 10 is placed in an air chamber containing less than 2% oxygen by volume but greater than 0%. The layered substrate 10 is heated to a temperature of about 400° C. to 700° C. at a speed of about 15/min to 30° C./min, and the temperature is maintained for 40 min to 90 min. The tin of the tin layer and the titanium of the titanium layer partially oxidize, which forms the bonding layer 13 including titanium, tin, tin oxide, and titanium dioxide. The portion of the tin layer without oxidation forms the catalyst layer 11.

The principle of forming the bonding layer 13 is as follows. The melting point of tin is lower than titanium. During the oxidation process, the oxygen molecules penetrate the titanium layer via the interstices of the titanium atoms and act with the tin atoms to form tin oxide. The tin oxide forms nanoneedle or nanorod structures, promoting oxidation of the titanium in the titanium layer.

Forming a hydrophobic layer 15 on the bonding layer 13 by magnetron sputtering. A silicon target is provided in the vacuum chamber and is electrically connected to the power source. A pressure in the vacuum chamber is in a range of $4*10^{-3}$ Pa to $5.3*10^{-3}$ Pa. Argon gas as a working gas is input to the vacuum chamber at a flow rate in a range of 300 sccm to 500 sccm. The power source connected to the silicon target is activated and a bias voltage in a range of −150V to −200V is applied to the silicon target. Nitrogen gas as an active gas is input to the chamber at a flow rate in a range of 100 sccm to 200 sccm. The temperature in the vacuum chamber is in a range of 150° C. to 200° C. A hydrophobic layer 15 is deposited on the bonding layer 13. The hydrophobic layer 15 is a silicon-nitrogen layer. The time of this depositing process is in a range of 20 min to 40 min. The power source connected to the silicon target is closed after depositing process.

The bonding layer 13 formed by the above method has a micron-nano mastoid structure on the substrate 10. This help the following hydrophobic layer 15 to be firmly attached to the surface of the bonding layer 13, increasing mechanical stability of the hydrophobic layer 15.

It is to be understood that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A coated article, comprising:
   a substrate;
   a catalyst layer made of tin and formed on the substrate;
   a bonding layer formed on the catalyst layer, the bonding layer including titanium, tin, stannic oxide and titanium dioxide; and
   a hydrophobic layer made of silicon-nitrogen and formed on the bonding layer.

2. The coated article as claimed in claim 1, wherein each of the catalyst layer, the bonding layer and the hydrophobic layer has a thickness of about 0.5 μm to 1.0 μm.

3. The coated article as claimed in claim 1, wherein the substrate is made of one of metal, ceramics and glass.

4. A method of making a coated article, comprising steps of:
   providing a substrate;
   forming a tin layer on the substrate by magnetron sputtering;
   forming a titanium layer on the tin layer by magnetron sputtering;
   applying a thermal oxidative treatment to the tin and titanium layered substrate to form a catalyst layer and a bonding layer including titanium, tin, stannic oxide and titanium dioxide; and
   forming a hydrophobic layer on the bonding layer by magnetron sputtering, the hydrophobic layer made of silicon-nitrogen.

5. The method as claimed in claim 4, wherein in the thermal oxidative treatment, the tin in the tin layer and the titanium in the titanium layer partially oxidize, which forms the bonding layer.

6. The method as claimed in claim 5, wherein during the thermal oxidative treatment, the tin and titanium layered substrate is heated to a temperature in a range of 400° C. to 700° C. at a speed in a range of 15° C./min to 30° C./min, and the temperature is maintained for 40 min to 90 min.

7. The method as claimed in claim 6, wherein the tin and titanium layered substrate is placed in an air chamber containing less than 2% oxygen by volume but greater than 0%.

8. The method as claimed in claim 5, wherein during the forming a tin layer, a tin target is provided and is applied to a bias voltage in a range of −100V to −200V, argon gas is provided as a working gas having a flow in a range of 300 sccm to 500 sccm, and the substrate is at a temperature in a range of 50° C. to 100° C.

9. The method as claimed in claim 5, wherein during the forming a hydrophobic layer, a titanium target is provided and is applied to a bias voltage in a range of −150V to −200V, argon gas is provided as a working gas having a flow in a range of 300 sccm to 500 sccm, and a temperature of the air is in a range of 50° C. to 100° C.

10. The method as claimed in claim 9, wherein during the forming a titanium layer, a titanium target is provided and is applied to a bias voltage in a range of −150V to −200V, argon gas is provided as a working gas having a flow in a range of 300 sccm to 500 sccm, nitrogen gas is provided as an active gas having a flow in a range of 100 sccm to 200 sccm, and a temperature of the air is in a range of 150° C. to 200° C.

* * * * *